(12) United States Patent
Gan et al.

(10) Patent No.: US 10,649,720 B2
(45) Date of Patent: *May 12, 2020

(54) SOUND EFFECT CONFIGURATION METHOD AND SYSTEM AND RELATED DEVICE

(71) Applicant: GUANGDONG OPPO MOBILE TELECOMMUNICATIONS CORP., LTD., Dongguan, Guangdong (CN)

(72) Inventors: Gaoting Gan, Dongguan (CN); Yajun Li, Dongguan (CN); Guang Tu, Dongguan (CN); Hai Yang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/249,702

(22) Filed: Jan. 16, 2019

(65) Prior Publication Data

US 2019/0220240 A1 Jul. 18, 2019

Related U.S. Application Data

(63) Continuation of application No. 16/072,094, filed as application No. PCT/CN2017/088505 on Jun. 15, 2017, now Pat. No. 10,503,464.

(30) Foreign Application Priority Data

Jun. 16, 2016 (CN) .......................... 2016 1 0438748

(51) Int. Cl.
G06F 3/16 (2006.01)
G10H 1/02 (2006.01)
(Continued)

(52) U.S. Cl.
CPC .............. G06F 3/165 (2013.01); G06F 3/167 (2013.01); G10H 1/02 (2013.01); H03G 5/165 (2013.01);
(Continued)

(58) Field of Classification Search
CPC .......... G06F 3/162; G06F 3/165; G06F 3/167; G10H 1/02; G10H 1/14; G10H 1/16;
(Continued)

(56) References Cited

U.S. PATENT DOCUMENTS 7,541,536 B2  6/2009  Daniel
9,319,019 B2 * 4/2016  Selig ....................... G06F 3/165
(Continued)

FOREIGN PATENT DOCUMENTS

CN      1728234 A     2/2006
CN    103458339 A    12/2013
(Continued)

OTHER PUBLICATIONS

International Search Report in international application No. PCT/CN2017/088505, dated Sep. 15, 2017.
(Continued)

Primary Examiner — Jesse A Elbin
(74) Attorney, Agent, or Firm — Ladas & Parry, LLP

(57) ABSTRACT

Disclosed are a sound effect configuration method and system and a related device. The method comprises: detecting a starting operation for a target application of a mobile terminal and determining a period for setting sound effect comprising system time, the target application being for controlling an audio output device; determining a reference parameter of sound effect according to a pre-stored mapping between periods for setting sound effect and parameters of sound effect of the audio output device, the reference parameter of sound effect corresponding to the period for
(Continued)

setting sound effect comprising the system time; sending a pre-configuration instruction comprising the reference parameter of sound effect to the audio output device, the pre-configuration instruction being for instructing the audio output device to create an instance of sound effect for an audio stream to be played according to the reference parameter of sound effect.

11 Claims, 2 Drawing Sheets

(51) Int. Cl.
  *H04M 19/04*   (2006.01)
  *H04M 1/725*   (2006.01)
  *H03G 5/16*    (2006.01)
  *H03G 5/00*    (2006.01)
  *H03G 3/30*    (2006.01)
  *H03G 3/00*    (2006.01)

(52) U.S. Cl.
  CPC ... *H04M 1/72563* (2013.01); *H04M 1/72566* (2013.01); *H04M 19/045* (2013.01); *H03G 3/001* (2013.01); *H03G 3/3089* (2013.01); *H03G 5/005* (2013.01); *H04M 1/72558* (2013.01)

(58) Field of Classification Search
  CPC ........ H03G 3/00; H03G 3/001; H03G 3/3089; H03G 5/005; H03G 5/165; H04M 1/72522; H04M 1/72547; H04M 1/72558; H04M 1/72563; H04M 1/72566; H04M 19/045
  USPC ............................................... 700/94; 381/61
  See application file for complete search history.

(56) References Cited

U.S. PATENT DOCUMENTS

| | | | |
|---|---|---|---|
| 9,363,597 | B1 | 6/2016 | Kulavik et al. |
| 2005/0287994 | A1 | 12/2005 | Serafat |
| 2008/0310610 | A1 | 12/2008 | Serafat |
| 2010/0304719 | A1 | 12/2010 | Deep |
| 2012/0310393 | A1* | 12/2012 | Stewart ................ G06F 3/165 700/94 |
| 2013/0332721 | A1* | 12/2013 | Chaudhri ............. G06F 3/016 713/100 |
| 2016/0057526 | A1* | 2/2016 | Jaffe .................. H04R 1/1083 381/74 |
| 2017/0192746 | A1* | 7/2017 | Jeong ................ G06F 3/04847 |

FOREIGN PATENT DOCUMENTS

| | | |
|---|---|---|
| CN | 104020979 A | 9/2014 |
| CN | 104090766 A | 10/2014 |
| CN | 104410748 A | 3/2015 |
| CN | 104883642 A | 9/2015 |
| CN | 104916295 A | 9/2015 |
| CN | 106155623 A | 11/2016 |
| WO | 03096660 A1 | 11/2003 |
| WO | 2007094204 A1 | 8/2007 |

OTHER PUBLICATIONS

English Translation of the Written Opinion of the International Search Authority in international application No. PCT/CN2017/088505, dated Sep. 15, 2017.
First Office action CN 106155623 A and translation for related Chinese Application 201610438748.9 provided by WIPO.
Notification to Grant Patent Right for Invention CN 106155623 A and translation for related Chinese Application 201610438748.9 provided by WIPO.
Supplementary European Search Report in the European application No. 17812750.2, dated Feb. 4, 2019.
Written Opinion of the International Search Authority issued for PCT/CN2017/088505 dated Sep. 15, 2017.
First Office Action issued for Chinese Application No. 201610438748.9 dated Jul. 27, 2017.
Notification to Grant Patent Right for Invention issued for Chinese Application No. 201610438748.9 dated Oct. 11, 2017.
International Preliminary Report on Patentability issued for PCT/CN2017/088505 dated Dec. 18, 2018.

\* cited by examiner

US 10,649,720 B2

SOUND EFFECT CONFIGURATION METHOD AND SYSTEM AND RELATED DEVICE

CROSS-REFERENCE TO RELATED APPLICATIONS

This is a continuation application of U.S. patent application Ser. No. 16/072,094 filed on Jul. 23, 2018, which is a national phase application of PCT/CN2017/088505 filed on Jun. 15, 2017 claiming priority to Chinese Patent Application No. 201610438748.9, filed on Jun. 16, 2016 and entitled "Sound effect configuration method and system and related device", the contents of these applications are incorporated by reference herein in their entireties.

TECHNICAL FIELD

The disclosure relates to the technical field of mobile terminals, and more particularly to a sound effect configuration method, a system and a related device.

BACKGROUND

With the increasing popularization of mobile terminal communication products such as mobile phones and tablet computers, a mobile terminal gradually becomes an indispensable communication tool in people's lives. An audio data playing function of the mobile terminal becomes one of basic functions most commonly used by people.

BRIEF DESCRIPTION OF DRAWINGS

In order to describe the technical solutions of the embodiments of the disclosure or the conventional art more clearly, the drawings required to be used in the embodiments or the conventional art will be simply introduced below. Obviously, the drawings described below are only some embodiments of the disclosure. Other drawings may further be obtained by those of ordinary skilled in the art according to these drawings without creative work.

DETAILED DESCRIPTION

In order to make the solutions of the disclosure to be better understood by those skilled in the art, the technical solutions in the embodiments of the disclosure will be clearly and completely described below in combination with the drawings in the embodiments of the disclosure. Obviously, the described embodiments are not all embodiments but only part of embodiments of the disclosure. All other embodiments obtained by those of ordinary skilled in the art on the basis of the embodiments in the disclosure without creative work shall fall within the scope of protection of the disclosure.

Terms "first", "second" and the like in the specification, claims and drawings of the disclosure are adopted to distinguish different objects, not to describe a specific sequence. In addition, terms "include" and "have" and any transformation thereof are intended to cover nonexclusive inclusions. For example, a process, a method, a system, a product or a device including a series of operations or units is not limited to the operations or units which are listed, but may optionally further include operations or units which are not listed or optionally further include other operations or units inherent to the process, the method, the product or the device.

"Embodiment" mentioned in the disclosure means that a specific characteristic, structure or property described in combination with the embodiment may be included in at least one embodiment of the disclosure. Such a phrase at each position in the specification may not always refer to the same embodiment as well as an independent or alternative embodiment mutually exclusive with the other embodiments. It should be understood explicitly and implicitly by those skilled in the art that the embodiments described in the disclosure may be combined with the other embodiments.

In order to better understand a sound effect configuration method, a system and a related device disclosed by the embodiments of the disclosure, the embodiments of the disclosure will be introduced below in detail.

Figure 1:
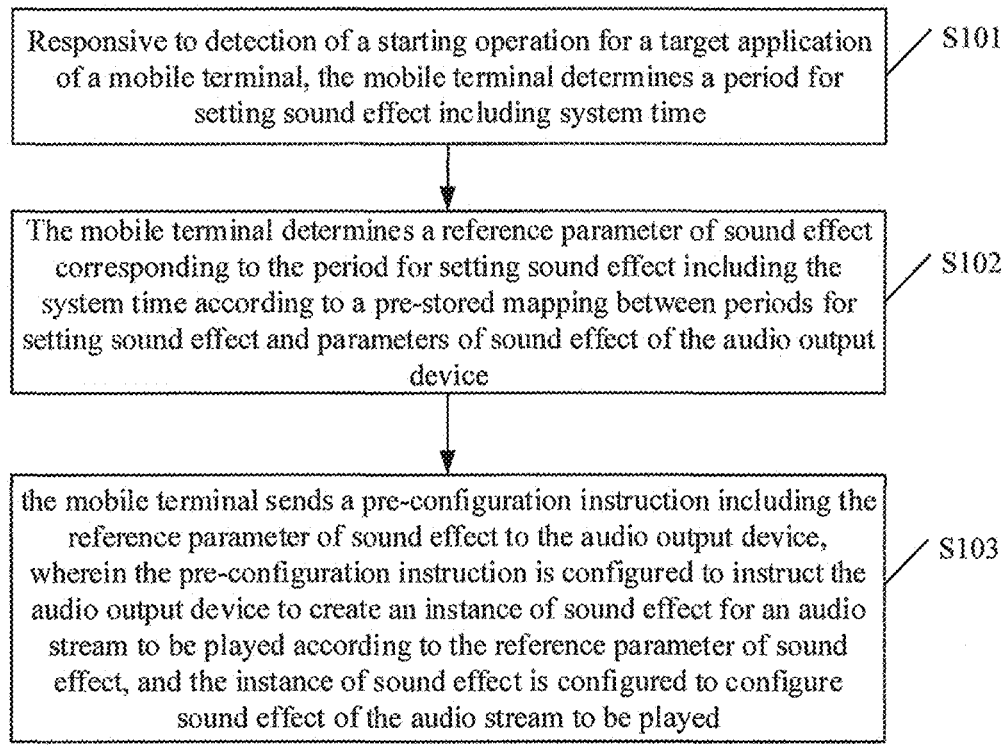
FIG. 1 is a schematic flowchart of a sound effect configuration method according to an embodiment of the disclosure.

Referring to FIG. 1, FIG. 1 is a sound effect configuration method according to an embodiment of the disclosure. As illustrated in FIG. 1, the sound effect configuration method includes the following operations.

In S101, responsive to detection of a starting operation for a target application of a mobile terminal is detected, the mobile terminal determines a period for setting sound effect including system time, wherein the target application is configured to control an audio output device.

In the example, a selection operation may be, for example, a touch operation for an application icon of the target application or a voice selection operation. The period for setting sound effect may be, for example, 7 AM to 8 AM, 8 AM to 9:30 AM, 12 AM to 1:30 PM and the like.

In the example, the audio output device may be a sound playing device with an operating system (for example, an Android operating system and an iOS), for example, a wireless loudspeaker, a wired loudspeaker and a vehicle-mounted music playing system.

In S102, the mobile terminal determines a reference parameter of sound effect corresponding to the period for setting sound effect including the system time according to a pre-stored mapping between periods for setting sound effect and parameters of sound effect of the audio output device.

In the example, the reference parameter of sound effect may include, for example, at least one of: a Compress parameter, an Amp-Type parameter, an EQ_Bass parameter, an EQ_Mid parameter, an EQ_Treble parameter or a Noise_Gate parameter.

In S103, the mobile terminal sends a pre-configuration instruction including the reference parameter of sound effect to the audio output device, wherein the pre-configuration instruction is configured to instruct the audio output device to create an instance of sound effect for an audio stream to be played according to the reference parameter of sound effect, and the instance of sound effect is configured to configure sound effect of the audio stream to be played.

In the example, an audio output module includes an audio data processing chip, an acoustical device such as a loudspeaker and the like. A type of the audio stream may be, for example, a prompt tone, a background sound, a song and a communication sound.

It can be seen that, compared with a solution in the conventional art that a user manually configures a sound effect of the audio output device, the mobile terminal in the embodiment of the disclosure determines the reference parameter of sound effect corresponding to the period for setting sound effect including the system time firstly and sends the pre-configuration instruction including the reference parameter of sound effect to the audio output device, and then the audio output device creates the instance of sound effect for the audio stream to be played according to the reference parameter of sound effect, so that the sound effect of the audio stream to be played of the audio output device may be automatically set without manual setting, thereby improving convenience and intelligence in sound effect setting and improving user experience.

In some embodiments of the disclosure, before the mobile terminal detects the starting operation for the target application of the mobile terminal, the following operations may further be executed.

The mobile terminal sends an acquisition request for parameters of sound effect to the audio output device, and receives an acquisition response sent by the audio output device in response to the acquisition request for the reference parameter of sound effect, wherein the acquisition response comprises a present parameter of sound effect of the audio output device. The mobile terminal determines that the present parameter of sound effect is mismatched with the reference parameter of sound effect, and outputs a prompting message for indicating sound effect abnormality.

In some embodiments of the disclosure, before the mobile terminal detects the starting operation for the target application of the mobile terminal, the following operations may further be executed.

The mobile terminal acquires N audio playing records of the audio output device, wherein the audio playing records comprise playing time of audio streams and parameters of sound effect of the audio streams, N being an integer more than 1. M periods for setting sound effect of the mobile terminal are created according to the playing time of the audio streams in the N audio playing records, M being a positive integer smaller than N. The mobile terminal determines a parameter of sound effect with a longest usage duration or a highest usage frequency or a largest usage number in each period for setting sound effect according to the audio playing records in each of the M periods for setting sound effect. And the mapping between the periods for setting sound effect and the parameters of sound effect is established.

In some embodiments of the disclosure, after the mobile terminal sends the pre-configuration instruction including the reference parameter of sound effect to the audio output device, the following operations may further be executed.

The mobile terminal displays a playing setting interface for the audio output device. When detecting a playing operation for the audio stream to be played on the playing setting interface, the mobile terminal generates a playing control instruction for the audio stream to be played. The playing control instruction is sent to the audio output device, wherein the playing control instruction is configured to instruct the audio output device to configure the sound effect of the audio stream to be played according to the instance of sound effect and play the audio stream to be played.

It can be seen that after receiving the playing control instruction for the audio stream to be played from the mobile terminal, the audio output device configures the sound effect of the audio stream to be played by virtue of the created instance of sound effect and plays the audio stream to be played, thereby avoiding a playing time delay and non-fluency caused by occupation of a kernel resource of the audio output device for sound effect configuration, facilitating to improve playing fluency of the audio output device and improving the user experience.

Figure 2:
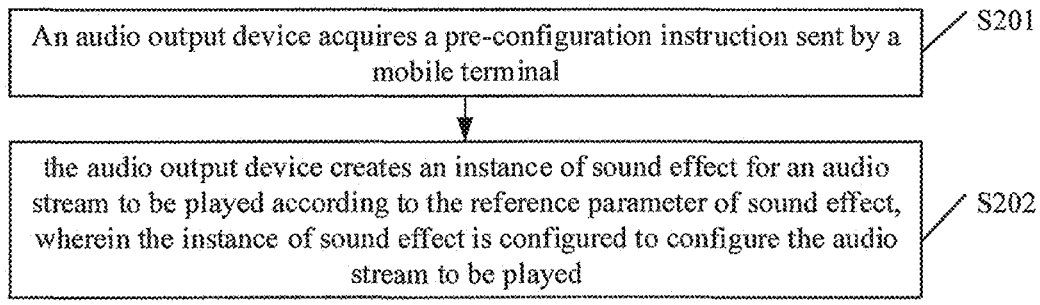
FIG. 2 is a schematic flowchart of another sound effect configuration method according to an embodiment of the disclosure.

Referring to FIG. 2, FIG. 2 is a flowchart of another sound effect configuration method according to an embodiment of the disclosure, which is consistent with the embodiment illustrated in FIG. 1. As illustrated in FIG. 2, the sound effect configuration method includes the following operations.

In S201, an audio output device acquires a pre-configuration instruction sent by a mobile terminal, wherein a reference parameter of sound effect in the pre-configuration instruction is determined by the mobile terminal according to a pre-stored mapping between periods for setting sound effect and parameters of sound effect of audio output device after determining a period for setting sound effect including system time, determination of the period for setting sound effect is responsive to detection of a starting operation for a target application of the mobile terminal, and the target application is configured to control the audio output device.

In the example, the reference parameter of sound effect may include, for example, at least one of:

a Compress parameter, an Amp-Type parameter, an EQ_Bass parameter, an EQ_Mid parameter, an EQ_Treble parameter or a Noise_Gate parameter.

In S202, the audio output device creates an instance of sound effect for an audio stream to be played according to the reference parameter of sound effect, wherein the instance of sound effect is configured to configure the audio stream to be played.

In the example, an audio output module includes an audio data processing chip, an acoustical device such as a loudspeaker and the like.

It can be seen that, compared with a solution in the conventional art that a user manually configures a sound effect of the audio output device, the mobile terminal in the embodiment of the disclosure determines the reference parameter of sound effect corresponding to the period for setting sound effect including the system time firstly and sends the pre-configuration instruction including the reference parameter of sound effect to the audio output device, and then the audio output device creates the instance of sound effect for the audio stream to be played according to the reference parameter of sound effect, so that the sound effect of the audio stream to be played of the audio output device may be automatically set without manual setting, thereby improving convenience and intelligence in sound effect setting and improving the user experience.

In some embodiments of the disclosure, after the audio output device creates the instance of sound effect for the audio stream to be played according to the reference parameter of sound effect, the following operations may further be executed.

The audio output device acquires a playing control instruction for the audio stream to be played from the mobile terminal. In response to the playing control instruction, the audio output device configures a sound effect of the audio stream to be played according to the instance of sound effect, and plays the audio stream to be played.

It can be seen that after receiving the playing control instruction for the audio stream to be played from the mobile terminal, the audio output device configures the sound effect of the audio stream to be played by virtue of the created instance of sound effect and plays the audio stream to be played, thereby avoiding a playing time delay and nonfluency caused by occupation of a kernel resource of the audio output device for sound effect configuration, facilitating to improve playing fluency of the audio output device and improving the user experience.

Figure 3:
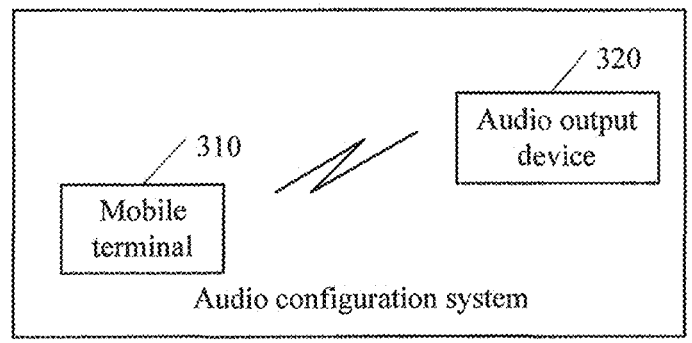
FIG. 3 is a system block diagram of a sound effect configuration system according to an embodiment of the disclosure.

Referring to FIG. 3, FIG. 3 is a system block diagram of a sound effect configuration system according to an embodiment of the disclosure, which is consistent with the embodiments illustrated in FIG. 1 and FIG. 2. As illustrated in FIG. 3, the sound effect configuration system includes a mobile terminal 310 and an audio output device 320.

The mobile terminal 310 is configured to, responsive to detection of a starting operation for a target application of the mobile terminal, determine a period for setting sound effect including system time, determine a reference parameter of sound effect according to a pre-stored mapping between periods for setting sound effect and parameters of sound effect of the audio output device, the reference parameter of sound effect corresponding to the period for setting sound effect including the system time, and send a pre-configuration instruction including the reference parameter of sound effect to the audio output device, wherein the target application may be configured to control the audio output device.

The audio output device 320 is configured to acquire the pre-configuration instruction sent by the mobile terminal and create an instance of sound effect for an audio stream to be played according to the reference parameter of sound effect, wherein the instance of sound effect may be configured to configure the audio stream to be played.

It can be seen that, compared with a solution in the conventional art that a user manually configures a sound effect of the audio output device, the mobile terminal in the embodiment of the disclosure determines the reference parameter of sound effect corresponding to the period for setting sound effect including the system time firstly and sends the pre-configuration instruction including the reference parameter of sound effect to the audio output device, and then the audio output device creates the instance of sound effect for the audio stream to be played according to the reference parameter of sound effect, so that the sound effect of the audio stream to be played of the audio output device may be automatically set without manual setting, thereby improving convenience and intelligence in sound effect setting and improving the user experience.

In some embodiments of the disclosure, the mobile terminal 310 may further be configured to display a playing setting interface for the audio output device, responsive to detection of a playing operation for the audio stream to be played on the playing setting interface, generate a playing control instruction for the audio stream to be played and send the playing control instruction to the audio output device.

The audio output device 320 may further be configured to acquire the playing control instruction, configure the sound effect of the audio stream to be played according to the instance of sound effect and play the audio stream to be played.

It can be seen that after receiving the playing control instruction for the audio stream to be played from the mobile terminal, the audio output device configures the sound effect of the audio stream to be played by virtue of the created instance of sound effect and plays the audio stream to be played, thereby avoiding a playing time delay and nonfluency caused by occupation of a kernel resource of the audio output device for sound effect configuration, facilitating to improve playing fluency of the audio output device and improving the user experience.

Figure 4:
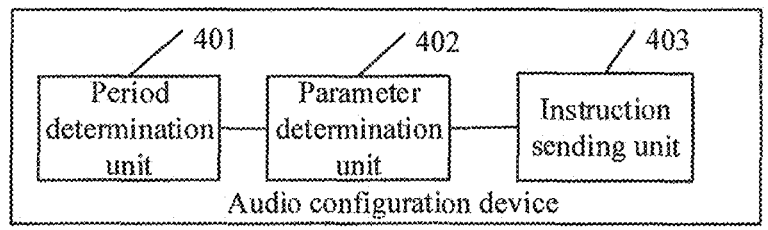
FIG. 4 is a composition block diagram of units of a sound effect configuration device according to an embodiment of the disclosure.

The below is an embodiment of a device of the disclosure. The device embodiment of the disclosure is used for executing the method in the method embodiment of the disclosure. As illustrated in FIG. 4, a mobile terminal may include a period determination unit 401, a parameter determination unit 402 and an instruction sending unit 403.

The period determination unit 401 is configured to, responsive to detection of a starting operation for a target application of the mobile terminal, determine a period for setting sound effect including system time, wherein the target application may be configured to control an audio output device.

The parameter determination unit 402 is configured to determine a reference parameter of sound effect according to a pre-stored mapping between periods for setting sound effect and parameters of sound effect of the audio output device, wherein the reference parameter of sound effect corresponds to the period for setting sound effect including the system time.

In at least one embodiment, the reference parameter of sound effect includes at least one of the following parameters:

a Compress parameter, an Amp-Type parameter, an EQ_Bass parameter, an EQ_Mid parameter, an EQ_Treble parameter or a Noise_Gate parameter.

The instruction sending unit 403 is configured to send a pre-configuration instruction including the reference parameter of sound effect to the audio output device, wherein the pre-configuration instruction may be configured to instruct the audio output device to create an instance of sound effect for an audio stream to be played according to the reference parameter of sound effect, and the instance of sound effect may be configured to configure a sound effect of the audio stream to be played.

In at least one embodiment, the mobile terminal may further include the following units.

A request sending unit, configured to, before the instruction sending unit 403 sends the pre-configuration instruction including the reference parameter of sound effect to the audio output device, send an acquisition request for parameters of sound effect to the audio output device.

A response receiving unit, configured to receive an acquisition response sent by the audio output device in response to the acquisition request for the reference parameter of sound effect, wherein the acquisition response comprises a present parameter of sound effect of the audio output device.

A prompting message output unit, configured to determine that the present parameter of sound effect is mismatched with the reference parameter of sound effect, and output a prompting message for indicating sound effect abnormity.

In at least one embodiment, the mobile terminal may further include the following units.

A playing record acquisition unit, configured to, before the period determination unit 401 detects the starting operation for the target application of the mobile terminal, acquire N audio playing records of the audio output device, wherein the audio playing records comprises playing time of audio streams and parameters of sound effect for playing the audio streams, N being an integer more than 1.

A period creation unit, configured to create M periods for setting sound effect of the mobile terminal according to the playing time of the audio streams in the N audio playing records, M being a positive integer smaller than N.

A parameter of sound effect selecting unit, configured to determine the parameter of sound effect with a longest usage duration or a highest usage frequency or a largest usage number in each period for setting sound effect according to the audio playing records included in each of the M periods for setting sound effect.

A relationship establishment unit, configured to establish the mapping between the periods for setting sound effect and the parameters of sound effect.

In at least one embodiment, the mobile terminal may further include the following units.

An interface display unit, configured to, after the pre-configuration instruction including the reference parameter of sound effect is sent by the instruction sending unit 403 to the audio output device and before a playing control instruction for the audio stream to be played is sent to the audio output device, display a playing setting interface for the audio output device.

An instruction generation unit, configured to, responsive to detection of a playing operation for the audio stream to be played on the playing setting interface, generate the playing control instruction for the audio stream to be played.

The instruction sending unit 403 may further be configured to send the playing control instruction to the audio output device, wherein the playing control instruction may be configured to instruct the audio output device to configure the sound effect of the audio stream to be played according to the instance of sound effect and play the audio stream to be played.

It is important to note that the mobile terminal described in the device embodiment of the disclosure is presented in form of a functional unit. Term "unit" used herein should be understood as a meaning which is as broad as possible and an object for realizing a described function of each "unit" may be, for example, an Application Specific Integrated Circuit (ASIC), a single circuit, a processor (shared, dedicated or chip unit) configured to execute one or more software or firmware programs and a memory, a combined logical circuit and/or other suitable components for realizing the above functions.

Figure 6:
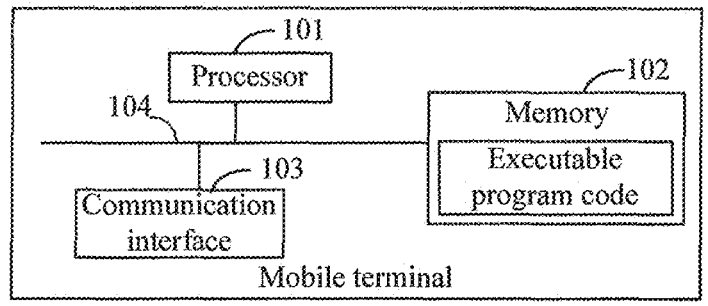
FIG. 6 is a schematic structure diagram of a mobile terminal according to an embodiment of the disclosure.

For example, the functions of the period determination unit 401 may be realized by a mobile terminal illustrated in FIG. 6. Specifically, a processor 101 may call an executable program code in a memory 102 to determine the period for setting sound effect including the system time when detecting the starting operation for the target application of the mobile terminal.

It can be seen that, compared with a solution in the conventional art that a user manually configures a sound effect of the audio output device, the mobile terminal in the embodiment of the disclosure determines the reference parameter of sound effect corresponding to the period for setting sound effect including the system time firstly and sends the pre-configuration instruction including the reference parameter of sound effect to the audio output device, and then the audio output device creates the instance of sound effect for the audio stream to be played according to the reference parameter of sound effect, so that the sound effect of the audio stream to be played of the audio output device may be automatically set without manual setting, thereby improving convenience and intelligence in sound effect setting and improving the user experience.

Figure 5:
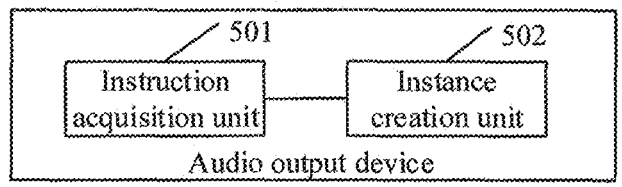
FIG. 5 is a composition block diagram of units of an audio output device according to an embodiment of the disclosure.

Referring to FIG. 5, FIG. 5 is a composition block diagram of units of an audio output device according to an embodiment of the disclosure. The audio output device is configured to execute the sound effect configuration method in the method embodiment of the disclosure. The audio output device may include an instruction acquisition unit 501 and an instance creation unit 502.

The instruction acquisition unit 501 is configured to acquire a pre-configuration instruction sent by a mobile terminal, wherein a reference parameter of sound effect in the pre-configuration instruction is determined by the mobile terminal according to a pre-stored mapping between periods for setting sound effect and parameters of sound effect of the audio output device after determining a period for setting sound effect including system time, determination of the period for setting sound effect is responsive to detection of a starting operation for a target application of the mobile terminal, and the target application is configured to control the audio output device.

The instance creation unit 502 is configured to create an instance of sound effect for an audio stream to be played according to the reference parameter of sound effect, wherein the instance of sound effect is configured to configure the audio stream to be played.

In at least one embodiment, the audio output device may further include the following unit.

The instruction acquisition unit may further be configured to, after the instance creation unit 502 creates the instance of sound effect for the audio stream to be played according to the reference parameter of sound effect, acquire a playing control instruction for the audio stream to be played from the mobile terminal.

A configuration playing unit, configured to, in response to the playing control instruction, configure a sound effect of the audio stream to be played according to the instance of sound effect and play the audio stream to be played.

It is important to note that audio output device described in the device embodiment of the disclosure is presented in form of a functional unit. Term "unit" used herein should be understood as a meaning which is as broad as possible and an object for realizing a described function of each "unit" may be, for example, an ASIC, a single circuit, a processor (shared, dedicated or chip unit) configured to execute one or more software or firmware programs and a memory, a combined logical circuit and/or other suitable components for realizing the above functions.

It can be seen that, compared with a solution in the conventional art that a user manually configures a sound effect of the audio output device, the mobile terminal in the embodiment of the disclosure determines the reference parameter of sound effect corresponding to the period for setting sound effect including the system time firstly and sends the pre-configuration instruction including the reference parameter of sound effect to the audio output device, and then the audio output device creates the instance of sound effect for the audio stream to be played according to the reference parameter of sound effect, so that the sound effect of the audio stream to be played of the audio output device may be automatically set without manual setting, thereby improving convenience and intelligence in sound effect setting and improving the user experience.

An embodiment of the disclosure further provides another mobile terminal. As illustrated in FIG. 6, the mobile terminal includes: a processor 101, a memory 102, a communication interface 103 and a communication bus 104, wherein the processor 101, the memory 102 and the communication interface 103 are connected through the communication bus 104 and complete the communication with each other. The processor 101 controls wireless communication with an external cellular network through the communication interface 103. The communication interface 103 includes, but not limited to, an antenna, an amplifier, a transceiver, a coupler, a Low Noise Amplifier (LNA), a duplexer and the like. The memory 102 includes at least one of a Random Access Memory (RAM), a non-volatile memory or an external memory. An executable program code is stored in the memory 102, and the executable program code may direct the processor 101 to execute a sound effect configuration method specifically disclosed in the method embodiment of the disclosure, including the following operations.

Responsive to detection of a starting operation for a target application of the mobile terminal, the processor 101 determines a period for setting sound effect including system time, wherein the target application is configured to control audio output device.

The processor 101 determines a reference parameter of sound effect corresponding to the period for setting sound effect including the system time according to a pre-stored mapping between periods for setting sound effect and parameters of sound effect of the audio output device.

The processor 101 sends a pre-configuration instruction including the reference parameter of sound effect to the audio output device, wherein the pre-configuration instruction is configured to instruct the audio output device to create an instance of sound effect for an audio stream to be played according to the reference parameter of sound effect, and the instance of sound effect is configured to configure a sound effect of the audio stream to be played.

It can be seen that, compared with a solution in the conventional art that a user manually configures a sound effect of the audio output device, the embodiment of the disclosure has the advantages that the mobile terminal determines the reference parameter of sound effect corresponding to the period for setting sound effect including the system time firstly and sends the pre-configuration instruction including the reference parameter of sound effect to the audio output device, and then the audio output device creates the instance of sound effect for the audio stream to be played according to the reference parameter of sound effect, so that the sound effect of the audio stream to be played of the audio output device may be automatically set without manual setting, thereby improving convenience and intelligence in sound effect setting and improving the user experience.

In addition, the executable program code stored in the memory 102 may further be configured to execute the related operations of the sound effect configuration method illustrated in FIG. 1, for example, executing the operation that a playing control instruction for the audio stream to be played is sent to the audio output device.

Figure 7:
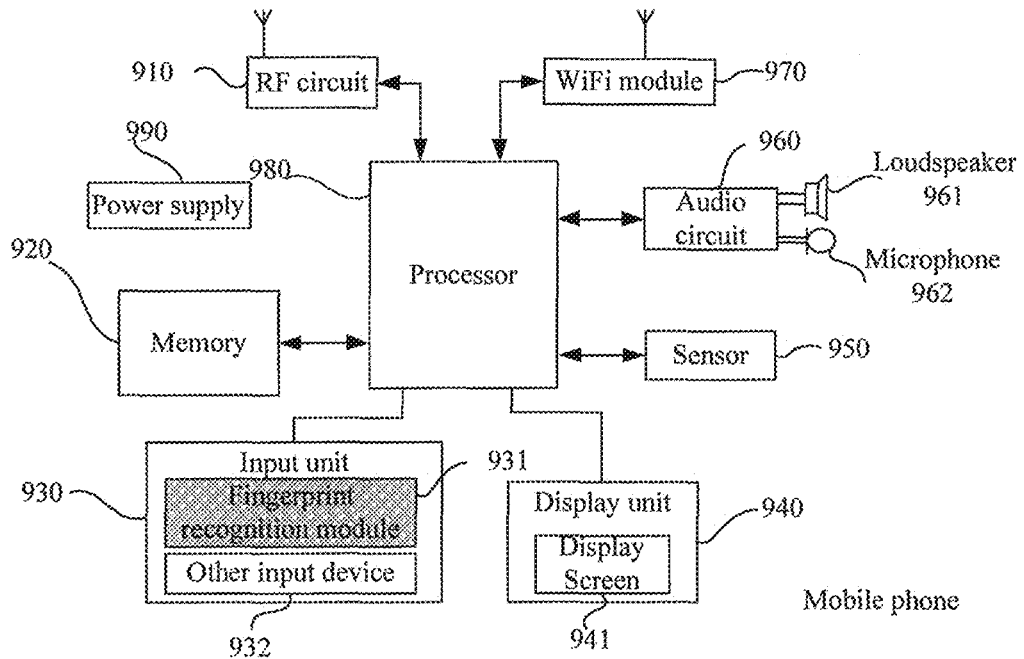
FIG. 7 is a schematic structure diagram of another mobile terminal according to an embodiment of the disclosure.

An embodiment of the disclosure further provides another mobile terminal. As illustrated in FIG. 7, for ease of description, only parts related to the embodiment of the disclosure are illustrated, and specific technical details which are undisclosed may refer to the method of the embodiments of the disclosure. The mobile terminal may be any terminal device including a mobile phone, a tablet computer, a Personal Digital Assistant (PDA), a Point of Sales (POS), a vehicle-mounted computer and the like. For example, the mobile terminal is a mobile phone.

FIG. 7 is a block diagram of a partial structure of a mobile phone related to a mobile terminal according to an embodiment of the disclosure. Referring to FIG. 7, the mobile phone includes components such as a Radio Frequency (RF) circuit 910, a memory 920, an input unit 930, a display unit 940, a sensor 950, an audio circuit 960, a Wireless Fidelity (WiFi) module 970, a processor 980 and a power supply 990. It should be understood by those skilled in the art that the structure of the mobile phone illustrated in FIG. 7 is not intended to limit the mobile phone, and may include components more or less than those illustrated in the figure or some components may be combined or different component arrangements may be adopted.

Each component of the mobile phone will be specifically introduced below in combination with FIG. 7.

The RF circuit 910 may be configured to receive and send information. The RF circuit 910 generally includes, but not limited to, an antenna, at least one amplifier, a transceiver, a coupler, an LNA, a duplexer and the like. In addition, the RF circuit 910 may also communicate with a network and other devices in a wireless communication manner. Any communication standard or protocol may be used for wireless communication, including, but not limited to, a Global System of Mobile communication (GSM), General Packet Radio Service (GPRS), Code Division Multiple Access (CDMA), Wideband Code Division Multiple Access (WCDMA), Long Term Evolution (LTE), an electronic mail, Short Messaging Service (SMS) and the like.

The memory 920 may be configured to store a software program and a module. The processor 980 operates the software program and the module stored in the memory 920 to execute various function applications and data processing of the mobile phone. The memory 920 may mainly include a program storage region and a data storage region, wherein the program storage region may store an operating system, an application program required by at least one function (for example, a sound effect instance creation function and an audio stream playing function) and the like, and the data storage region may store data (for example, parameters of sound effect) created according to use of the mobile phone and the like. In addition, the memory 920 may include a high-speed RAM, and may further include a non-volatile memory, for example, at least one disk storage device, flash memory device or other volatile solid-state storage devices.

The input unit 930 may be configured to receive input digital or character information and generate key signal input related to user setting and function control of the mobile phone. Specifically, the input unit 930 may include a fingerprint recognition module 931 and other input device 932. The fingerprint recognition module 931 may collect fingerprint data of a user thereon. In at least one embodiment, the fingerprint recognition module 931 may include an optical fingerprint module, a capacitive fingerprint module and an RF fingerprint module. For example, when the fingerprint recognition module 931 is a capacitive fingerprint recognition module, the fingerprint recognition module specifically includes a sensing electrode (abnormity sensing electrode and normality sensing electrode) and a signal processing circuit (for example, an amplification circuit, a noise suppression circuit and an analogue-to-digital conversion circuit) connected with the sensing electrode. Besides the fingerprint recognition module 931, the input unit 930 may further include the other input device 932. Specifically, the other input device 932 may include, but not limited to, one or more of a physical keyboard, a function key (for example, a volume control key and an on-off key), a trackball, a mouse, a joystick and the like.

The display unit 940 may be configured to display information input by the user or information provided for the user and various menus of the mobile phone. The display unit 940 may include a display screen 941. In at least one embodiment, the display screen 941 may be configured in form of a Liquid Crystal Display (LCD), an Organic Light-Emitting Diode (OLED) and the like. Although the fingerprint recognition module 931 and the display screen 941 in FIG. 7 are taken as two independent components to realize input and output functions of the mobile phone, the fingerprint recognition module 931 and the display screen 941 may be integrated to realize the input and output functions of the mobile phone in some embodiments.

The mobile phone may further include at least one sensor 950, for example, a light sensor, a motion sensor and another sensor. Specifically, the light sensor may include an environmental light sensor and a proximity sensor, wherein the environmental light sensor may regulate brightness of the display screen 941 according to brightness of environmental light, and the proximity sensor may turn off the display screen 941 and/or backlight when the mobile phone is moved to an ear. As a motion sensor, an accelerometer sensor may detect a magnitude of an acceleration in each direction (usually three axes), may detect a magnitude and direction of the gravity under a motionless condition, and may be configured for an application recognizing a posture of the mobile phone (for example, landscape and portrait switching, a related game and magnetometer posture calibration), a vibration recognition related function (for example, a pedometer and knocking) and the like. Other sensors which may be configured in the mobile phone, such as a gyroscope, a barometer, a hygrometer, a thermometer and an infrared sensor, will not be elaborated herein.

The audio circuit 960, a loudspeaker 961 and a microphone 962 may provide an audio interface between the user and the mobile phone. The audio circuit 960 may transmit an electric signal converted from received audio data to the loudspeaker 961, and then the loudspeaker 961 converts it into a sound signal for output. On the other aspect, the microphone 962 converts a collected sound signal into an electric signal, and then the audio circuit 960 receives the electric signal and converts it into audio data and outputs the audio data to the processor 980 for processing and send to, for example, another mobile phone through the RF circuit 910 or outputs the audio data to the memory 920 for further processing.

WiFi is a short-distance wireless communication technology. The mobile phone may help the user to receive and send an electronic mail, browse a webpage, access streaming media and the like through the WiFi module 970, which provides wireless broadband Internet access for the user. Although the WiFi module 970 is illustrated in FIG. 7, it can be understood that it is not a necessary component of the mobile phone and may completely be omitted according to a requirement without changing the essence of the disclosure.

The processor 980 is a control center of the mobile phone, connects each part of the whole mobile phone by virtue of various interfaces and lines, and executes various functions and data processing of the mobile phone by operating or executing the software program and/or module stored in the memory 920 and calling data stored in the memory 920, thereby monitoring the whole mobile phone. In at least one embodiment, the processor 980 may include one or more processing units. Preferably, the processor 980 may integrate an application processor and a modem processor, wherein the application processor mainly processes the operating system, a user interface, an application program and the like, and the modem processor mainly processes wireless communication. It can be understood that the modem processor may also not be integrated into the processor 980.

The mobile phone further includes the power supply 990 (for example, a battery) supplying power to each component. Preferably, the power supply may be logically connected with the processor 980 through a power management system, thereby realizing functions of charging and discharging management, power consumption management and the like through the power management system.

Although being not illustrated in the figure, the mobile phone may further include a camera, a Bluetooth module and the like, which will not be elaborated herein.

In the embodiment illustrated in FIG. 1, each operation of the method may be implemented on the basis of the structure of the mobile phone.

In the embodiment illustrated in FIG. 4, the function of each unit may be realized on the basis of the structure of the mobile phone.

An embodiment of the disclosure further provides a computer storage medium, wherein the computer storage medium may store a program, and when the program is executed, part or all of the operations of any sound effect configuration method in the method embodiment are included.

It is important to note that, for simple description, each method embodiment is expressed into a combination of a series of actions. However, those skilled in the art should know that the disclosure is not limited by an action sequence described herein because some operations may be executed in another sequence or at the same time according to the disclosure. Second, those skilled in the art should also know that the embodiments described in the specification all belong to preferred embodiments and the involved actions and modules are not always necessary to the disclosure.

Each embodiment in the abovementioned embodiments is described with different emphases, and undetailed parts in a certain embodiment may refer to related descriptions in the other embodiments.

In some embodiments provided by the application, it should be understood that the disclosed device may be implemented in another manner. For example, the device embodiment described above is only schematic, and for example, division of the units is only logical function division, and other division manners may be adopted during practical implementation. For example, multiple units or components may be combined or integrated into another system, or some characteristics may be neglected or not executed. In addition, coupling or direct coupling or communication connection between displayed or discussed components may be indirect coupling or communication connection, implemented through some interfaces, of the device or the units, and may be electrical or adopt other forms.

The units described as separate parts may or may not be physically separated, and parts displayed as units may or may not be physical units, and namely may be located in the same place, or may also be distributed to multiple network units. Part or all of the units may be selected to achieve the purpose of the solutions of the embodiments according to a practical requirement.

In addition, functional units in each embodiment of the disclosure may be integrated into a processing unit, each unit may also physically exist independently, and two or more than two units may also be integrated into a unit. The integrated unit may be implemented in a hardware form and may also be implemented in form of software functional unit.

When being implemented in form of software functional unit and sold or used as an independent product, the integrated unit may be stored in a computer-readable memory. Based on such an understanding, the technical solutions of the disclosure substantially or parts making contributions to the conventional art or all or part of the technical solutions may be embodied in form of software product, and the computer software product is stored in a memory, including a plurality of instructions configured to enable a piece of computer equipment (which may be a personal computer, a server, network equipment or the like) to execute all or part of the operations of the method in each embodiment of the disclosure. The memory includes: various media capable of storing program codes such as a U disk, a Read-Only Memory (ROM), a RAM, a mobile hard disk, a magnetic disk or an optical disk.

Those of ordinary skilled in the art can understand that all or part of the operations in various methods of the embodiments may be completed by related hardware instructed by a program. The program may be stored in a computer-readable memory, and the memory may include a flash disk, a ROM, a RAM, a magnetic disk, an optical disk or the like.

The embodiments of the application are introduced above in detail, the principle and implementation modes of the disclosure are elaborated with specific examples in the disclosure, and the descriptions made to the embodiments are only adopted to help the method of the disclosure and the core concept thereof to be understood. In addition, those of ordinary skilled in the art may make variations to the specific implementation modes and the application scope according to the concept of the disclosure. From the above, the contents of the specification should not be understood as limits to the disclosure.

What is claimed is:

1. A sound effect configuration method, comprising:
   detecting a starting operation for a target application of a mobile terminal, and determining, from preset periods for setting audio effect, a period for setting sound effect comprising system time, wherein the target application is configured to control an audio output device;
   determining a reference parameter of sound effect according to a pre-stored mapping between periods for setting sound effect and parameters of sound effect of the audio output device, wherein the reference parameter of sound effect corresponds to the period for setting sound effect comprising the system time, and the reference parameter of sound effect comprises an Amp-Type parameter; and
   sending a pre-configuration instruction comprising the reference parameter of sound effect to the audio output device, wherein the pre-configuration instruction is configured to instruct the audio output device to create an instance of sound effect according to the reference parameter of sound effect, and the instance of sound effect is created for an audio stream to be played and configured to configure sound effect of the audio stream to be played,
   wherein the processor is further configured to execute operations comprising: before sending the pre-configuration instruction comprising the reference parameter of sound effect to the audio output device, the method further comprises:
   sending an acquisition request for parameters of sound effect to the audio output device;
   receiving an acquisition response sent by the audio output device in response to the acquisition request for the reference parameter of sound effect, wherein the acquisition response comprises a present parameter of sound effect of the audio output device; and
   determining that the present parameter of sound effect is mismatched with the reference parameter of sound effect, outputting a prompting message for indicating sound effect abnormality.

2. The method according to claim 1, wherein the reference parameter of sound effect further comprises at least one of a Compress parameter, an EQ_Bass parameter, an EQ_Mid parameter, an EQ_Treble parameter or a Noise_Gate parameter.

3. The method according to claim 1, before detecting the starting operation for the target application of the mobile terminal, further comprising:
   acquiring N audio playing records of the audio output device, wherein the audio playing records comprise playing time of audio streams and parameters of sound effect for playing the audio streams, N being an integer more than 1;
   creating M periods for setting sound effect of the mobile terminal according to the playing time of the audio streams in the N audio playing records, M being a positive integer smaller than N;
   determining the parameter of sound effect with a longest usage duration or a highest usage frequency or a largest usage number in each period for setting sound effect according to the audio playing records in each of the M periods for setting sound effect; and
   establishing the mapping between the periods for setting sound effect and the parameters of sound effect.

4. The method according to claim 3, after sending the pre-configuration instruction comprising the reference parameter of sound effect to the audio output device, further comprising:
   displaying a playing setting interface for the audio output device;
   responsive to detection of a playing operation for the audio stream to be played on the playing setting interface, generating a playing control instruction for the audio stream to be played; and
   sending the playing control instruction to the audio output device, wherein the playing control instruction is configured to instruct the audio output device to configure the sound effect of the audio stream to be played according to the instance of sound effect and play the audio stream to be played.

5. A sound effect configuration system, comprising a mobile terminal and an audio output device, wherein
   the mobile terminal is configured to, responsive to detection of a starting operation for a target application of the mobile terminal, determine, from preset periods for setting audio effect, a period for setting sound effect comprising system time, determine a reference parameter of sound effect according to a pre-stored mapping between periods for setting sound effect and parameters of sound effect of the audio output device, the reference parameter of sound effect corresponding to the period for setting sound effect comprising the system time, and send a pre-configuration instruction comprising the reference parameter of sound effect to the audio output device, wherein the target application is configured to control the audio output device;
   wherein the reference parameter of sound effect comprises an Amp-Type parameter; and
   the audio output device is configured to acquire the pre-configuration instruction sent by the mobile terminal and create an instance of sound effect for an audio stream to be played according to the reference parameter of sound effect, wherein the instance of sound effect is configured to configure the audio stream to be played, wherein the mobile terminal is further configured to: before sending the pre-configuration instruction comprising the reference parameter of sound effect to the audio output device, send an acquisition request for parameters of sound effect to the audio output device;

receive an acquisition response sent by the audio output device in response to the acquisition request for the reference parameter of sound effect, wherein the acquisition response comprises a present parameter of sound effect of the audio output device; and determine that the present parameter of sound effect is mismatched with the reference parameter of sound effect, output a prompting message for indicating sound effect abnormality.

6. The system according to claim 5, wherein the mobile terminal is further configured to display a playing setting interface for the audio output device, responsive to detection of a playing operation for the audio stream to be played on the playing setting interface, generate a playing control instruction for the audio stream to be played and send the playing control instruction to the audio output device; and the audio output device is further configured to acquire the playing control instruction, configure the sound effect of the audio stream to be played according to the instance of sound effect and play the audio stream to be played.

7. A mobile terminal, comprising:

a period determination unit, configured to detect a starting operation for a target application of a mobile terminal and determine, from preset periods for setting audio effect, a period for setting sound effect comprising system time, wherein the target application is configured to control an audio output device;

a parameter determination unit, configured to determine a reference parameter of sound effect according to a pre-stored mapping between periods for setting sound effect and parameters of sound effect of the audio output device, wherein the reference parameter of sound effect corresponds to the period for setting sound effect comprising the system time;

wherein the reference parameter of sound effect comprises an Amp-Type parameter;

an instruction sending unit, configured to send a pre-configuration instruction comprising the reference parameter of sound effect to the audio output device, wherein the pre-configuration instruction is configured to instruct the audio output device to create an instance of sound effect according to the reference parameter of sound effect, and the instance of sound effect is created for an audio stream to be played and configured to configure sound effect of the audio stream to be played;

a request sending unit, configured to, before the instruction sending unit sends the pre-configuration instruction comprising the reference parameter of sound effect to the audio output device, send an acquisition request for parameters of sound effect to the audio output device;

a response receiving unit, configured to receive an acquisition response sent by the audio output device in response to the acquisition request for the reference parameter of sound effect, wherein the acquisition response comprises a present parameter of sound effect of the audio output device; and a prompting message output unit, configured to determine that the present parameter of sound effect is mismatched with the reference parameter of sound effect, and output a prompting message for indicating sound effect abnormality.

8. An audio output device, comprising:

an instruction acquisition unit, configured to acquire a pre-configuration instruction sent by a mobile terminal, wherein the pre-configuration instruction comprises a reference parameter of sound effect, and the reference parameter of sound effect is determined by the mobile terminal according to a pre-stored mapping between periods for setting sound effect and parameters of sound effect of an audio output device after determining a period for setting sound effect comprising system time, determination of the period for setting sound effect being responsive to detection of a starting operation for a target application of the mobile terminal, the target application being configured to control the audio output device;

wherein the reference parameter of sound effect comprises an Amp-Type parameter; and an instance creation unit, configured to create an instance of sound effect for an audio stream to be played according to the reference parameter of sound effect, wherein the instance of sound effect is configured to configure the audio stream to be played.

9. A mobile terminal, comprising:

a processor, a memory, a communication interface and a communication bus, wherein the processor, the memory and the communication interface are connected through the communication bus and complete mutual communication with each other; wherein the memory stores an executable program code;

the communication interface is configured for wireless communication; and the processor is configured to call the executable program code in the memory to execute a sound effect configuration method comprising the following operations:

detecting a starting operation for a target application of a mobile terminal, and determining, from preset periods for setting audio effect, a period for setting sound effect comprising system time, wherein the target application is configured to control an audio output device;

determining a reference parameter of sound effect according to a pre-stored mapping between periods for setting sound effect and parameters of sound effect of the audio output device, wherein the reference parameter of sound effect corresponds to the period for setting sound effect comprising the system time, and the reference parameter of sound effect comprises an Amp-Type parameter; and sending a pre-configuration instruction comprising the reference parameter of sound effect to the audio output device, wherein the pre-configuration instruction is configured to instruct the audio output device to create an instance of sound effect according to the reference parameter of sound effect, and the instance of sound effect is created for an audio stream to be played and configured to configure sound effect of the audio stream to be played, wherein the processor is further configured to execute operations comprising: before sending the pre-configuration instruction comprising the reference parameter of sound effect to the audio output device, the method further comprises:
- sending an acquisition request for parameters of sound effect to the audio output device;
- receiving an acquisition response sent by the audio output device in response to the acquisition request for the reference parameter of sound effect, wherein the acquisition response comprises a present parameter of sound effect of the audio output device; and
- determining that the present parameter of sound effect is mismatched with the reference parameter of sound effect, outputting a prompting message for indicating sound effect abnormality.

10. The mobile terminal according to claim 9, wherein the processor is further configured to execute operations comprising: before detecting the starting operation for the target application of the mobile terminal,
- acquiring N audio playing records of the audio output device, wherein the audio playing records comprise playing time of audio streams and parameters of sound effect for playing the audio streams, N being an integer more than 1;
- creating M periods for setting sound effect of the mobile terminal according to the playing time of the audio streams in the N audio playing records, M being a positive integer smaller than N;
- determining the parameter of sound effect with a longest usage duration or a highest usage frequency or a largest usage number in each period for setting sound effect according to the audio playing records in each of the M periods for setting sound effect; and
- establishing the mapping between the periods for setting sound effect and the parameters of sound effect.

11. The mobile terminal according to claim 10, wherein the processor is further configured to execute operations comprising: after sending the pre-configuration instruction comprising the reference parameter of sound effect to the audio output device,
- displaying a playing setting interface for the audio output device;
- responsive to detection of a playing operation for the audio stream to be played on the playing setting interface, generating a playing control instruction for the audio stream to be played; and
- sending the playing control instruction to the audio output device, wherein the playing control instruction is configured to instruct the audio output device to configure the sound effect of the audio stream to be played according to the instance of sound effect and play the audio stream to be played.

* * * * *